(12) United States Patent
Ismail et al.

(10) Patent No.: US 7,180,316 B1
(45) Date of Patent: Feb. 20, 2007

(54) PROBE HEAD WITH MACHINED MOUNTING PADS AND METHOD OF FORMING SAME

(75) Inventors: Salleh Ismail, Moorpark, CA (US);
Raffi Garabedian, Monrovia, CA (US);
Steven Wang, Hacienda Heights, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 0 days.

(21) Appl. No.: 11/346,954

(22) Filed: Feb. 3, 2006

(51) Int. Cl.
*G01R 31/02* (2006.01)
(52) U.S. Cl. .................................... 324/754
(58) Field of Classification Search ............... None
See application file for complete search history.

(56) References Cited

U.S. PATENT DOCUMENTS 6,677,771 B2 * 1/2004 Zhou et al. ................. 324/758

FOREIGN PATENT DOCUMENTS

EP 0567332 A2 10/1993
WO WO 2004/056698 A2 7/2004

OTHER PUBLICATIONS

Jun-Bo Yoon et al., Monolithic Integration of 3-D Electroplated Microstructures With Unlimited Number of Levels Using Planarization With A Scarificial Metallic Mold (PSMM), pp. 624 thru 629, no date.

* cited by examiner

*Primary Examiner*—Jermele Hollington
*Assistant Examiner*—Trung Q. Nguyen
(74) *Attorney, Agent, or Firm*—Pillsbury Winthrop Shaw Pittman LLP

(57) ABSTRACT

A probe head for testing semiconductor wafers has a probe contactor substrate have a first side and a second side. A plurality of probe contactor tips are coupled to the first side and the plurality of tips lie in a first plane. A plurality of mounting structures are coupled to the second side with each of the mounting structures each having a top surface lying in a second plane, wherein the first plane is substantially parallel to the second plane.

31 Claims, 4 Drawing Sheets

PROBE HEAD WITH MACHINED MOUNTING PADS AND METHOD OF FORMING SAME

BACKGROUND OF THE INVENTION

1. Field of the Invention

Embodiments of the present invention are directed to a probe head assembly used in semiconductor testing apparatus, and more particularly to a probe contactor substrate having probe contactors electroplated on a first side and machined mounting pads electroplated on a second side.

2. Description of Related Art

A modern probe card assembly used to test wafers of semiconductor chips generally consists of a Printed Circuit Board (PCB) (also referred to as a printed wiring board or probe card wiring board), a probe contactor substrate having probes for contacting the wafer (sometimes referred as a probe head), and an interposer connecting the PCB to the probe contactor substrate.

Probes (also referred to as probe contactors) are generally compliant mechanisms including at least one spring which have some limited range of compliance in a vertical direction (the "z" direction). Some probes have minimal or no compliance. When in use, a wafer under test is urged upward to contact the tips of the probes. In practice, there is some manufacturing process-related z error (non-planarity of the probe tips) caused by film stresses, etch control, assembly control, etc. as well as systemic z errors caused by a warping or curving in the surface of the probe contactor substrate. If the probe contactor substrate is curved or warped, so will be the imaginary surface that goes through the tips (assuming that the probes are of uniform height). Thus some probe tips will contact the wafer first (called the first touch z height) and some probe tips will contact the wafer last (last touch z height). Because probes generally have a limited range of compliance (as small as 50 µm or less for many compliant microfabricated technologies and effectively 0 for non-compliant technologies), it is desirable to minimize both the process-related and systemic errors in tip z height. Some errors are most directly related to the fabrication of the probes on the probe contactor substrate rather than the probe card assembly design. However, some errors are usually directly related to the probe card assembly and the way the probe contactor substrate (or substrates) are mounted to the rest of the probe card assembly. The minimization of these latter errors is the subject of the present invention.

In older probe card applications, a prober has a surface which has been planarized to that of the chuck that carries the wafer under test. The probe card PCB is generally mounted to this planarized surface of the prober. Thus, such probe card assemblies require well controlled parallelism between the plane of the probe tips (the best-fit plane that minimizes the overall root-mean-square z error between the probe tips and the plane) and the plane of the PCB (the PCB can be thought of as the "reference plane"). If the probe tips are co-planar with the PCB, then they are also co-planar with the chuck, and thus with the wafer under test. Such a design will lead to a more uniform contact of the probes to the wafer under test (less of a distance between first touch z distance and last touch z distance). In newer probe cards, the probe tips are referenced to mounting points on the probe card which are typically kinematic mounts of some type (used here to describe a mount that provides accurate and repeatable mechanical docking of the probe card into the test equipment and provides constraint in at least the two degrees of freedom necessary to achieve parallelism to the plane of the wafer chuck). In either case, it is necessary to align the tips of the probe contactors such that they are parallel to a reference plane which is itself parallel to the plane of the wafer chuck. Furthermore, it is desirable to mount the probe head to the probe card assembly in a fixed manner without the need for shimming or dynamic adjustment of the planarity of the probe card substrate once it has been mounted.

A common problem with mounting the probe head to the probe card assembly, is that the probe contactor substrate 100 to which the probe contactors 110 are attached is generally non-uniform and has thickness variations across its surface, as shown in FIG. 1. (While not shown in FIG. 1, the front side of the probe contactor substrate may also have variations in the in the thickness as well, however, the method of forming the probe contactors on the substrate accounts for this and allows the tips of the probe contactor to be coplanar.) The probe contactor substrate 100 is generally mounted to the probe card assembly 200 in such a manner that the planarity is set by the location of discrete points along the back surface (the surface opposite of the probe contactors) of the probe contactor substrate 100 and thus, due to the non-uniform thickness of the probe contactor substrate, the plane 210 of the probe contactor tips may not be co-planar with the plane 220 of the reference plane as shown in FIG. 2. It is a further problem that due to manufacturing tolerances or errors, the overall heights of the probe contactors can vary linearly across the substrate such that when referenced from the back of a planar substrate, the probe tips lie in a plane that is tilted.

It is a further problem that in applications requiring more than one probe contactor substrate to function in unison, the overall thickness or z distance between the back of each substrate to the tips of the substrates should be identical to eliminate the need to individually compensate the mounting means of the substrates for variation in thickness.

Thus, what is needed is a probe head which has mounting structures (for mounting to the probe card assembly) that are planar to each other and co-planar with the plane of the tips of the probe contactors and are a known predetermined distance from the plane of the tips.

BRIEF SUMMARY OF THE INVENTION

In the present invention, rather than adjust the orientation of the substrate to the reference plane after mounting or during the process of mounting, mounting structures are provided on a back side of the substrate which are a precise z distance from the probe contactor tips and the plane of the mounting structures are parallel to the plane of the probe contactor tips. These machined mounting structures are meant to alleviate the concerns caused by the non-uniformity of the probe contactor substrate or in tilt of the plane of the probe contactor tips relative to the substrate in that they the mounting points are machined to be planar to one another and parallel to the plane of the tips of the probe contactors. Thus, the probe head may be fixedly mounted to the probe card assembly, using these mounting structures, without the need for shimming or adjustment of planarity during the mounting process. Moreover, these machined mounting structures may be electroplated on to the back of the probe contactor substrate using the same processes utilized when the probe contactors are electroplated to the probe contactor substrate, thus saving time and expense.

DETAILED DESCRIPTION OF THE INVENTION

Figure 1:
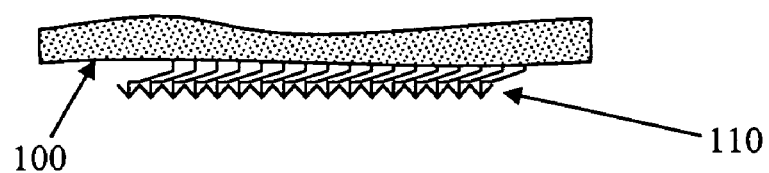
FIG. 1 illustrates a probe head as is known in the art.
Figure 2:
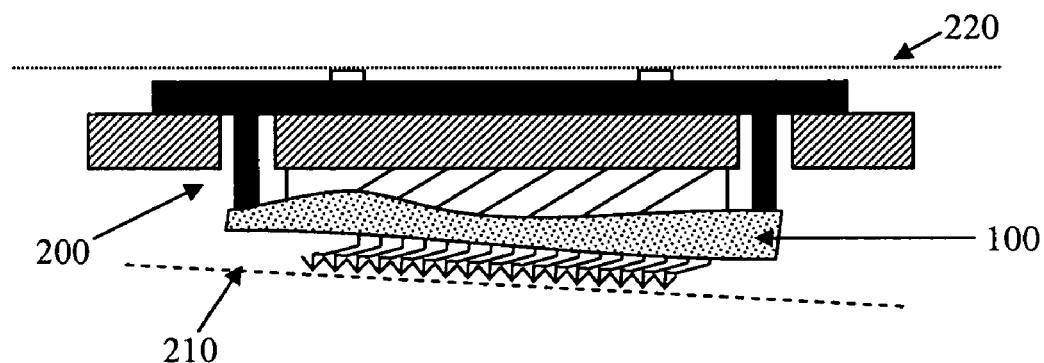
FIG. 2 illustrates a probe card assembly as is known in the art.
Figure 3:
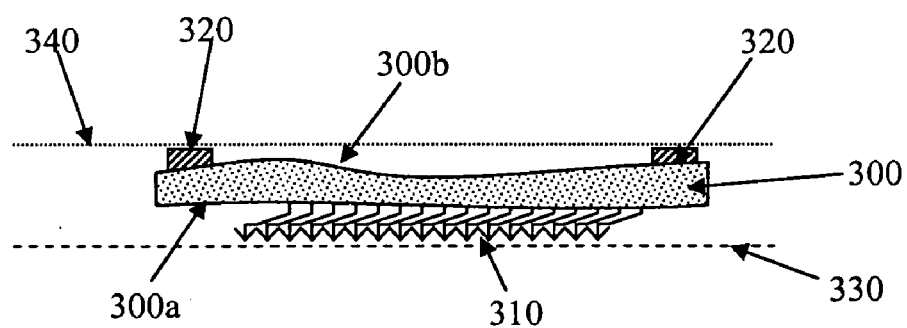
FIG. 3 illustrates a probe head according to an embodiment of the present invention.

FIG. 3 illustrates a probe head according to an embodiment of the present invention. A probe contactor substrate 300 has a plurality of probe contactors 310 coupled to a first side 300a of the probe contactor substrate 300. On a second side 300b, opposite the side with the probe contactors 310, a plurality of mounting structures 320 are coupled to the probe contactor substrate 300. According to an embodiment of the present invention, the top surfaces of the mounting structures 320 lie in a plane 340 wherein the top surfaces of the mounting structures are co-planar (although in FIG. 3 only two mounting structures are shown, there will generally be at least three mounting structures to define a plane in three-dimensional space), and wherein the plane 340 of the mounting structures is parallel to the plane 330 of the tips of the probe contactors 310. While the overall planarity target of the probe card may be customer specified, ideally the plane 340 of the mounting structures should be within +/−10 µm total error from parallelism relative to the plane 330 of the tips of the probe contactors.

The mounting structures 320 may be of any shape or size. They may be round, square, rectangular, "doughnut" or any other convenient shape for mounting to a mechanical structure. The mounting structures may include additional alignment features for locating the substrate in x and y directions. The mounting structures may be made of any rigid and thermally stable material that will conveniently serve the mounting function (for example any metal, epoxy, even glass or ceramic). The mounting structures of course are planarized and the material is selected so as to accommodate a planarization machining step such as grinding or cutting, including milling and fly-cutting for example with a single point diamond fly-cutter. The preferred material is Ni or a Ni alloy. The mounting structures may include features for the convenient and effective use of adhesive mounts. Such features include wells or pockets to capture and wick adhesive at an appropriate adhesive bond line thickness when the mounting structure surface is firmly seated against a corresponding surface.

Figure 9:
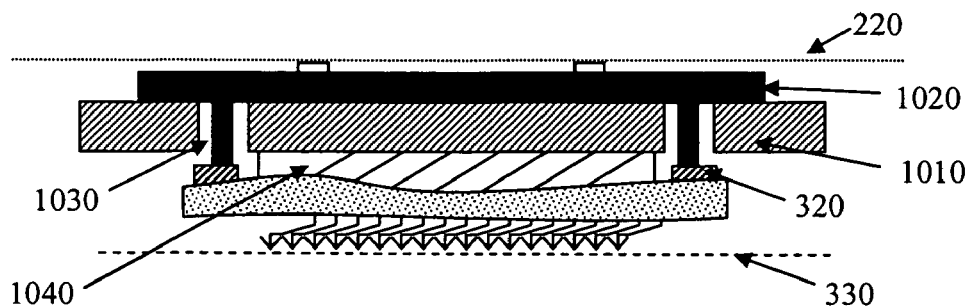
FIG. 9 illustrates a probe card assembly according to an embodiment of the present invention.

As shown in FIG. 9, the rest of the probe card assembly may then be coupled to the probe head at the mounting structures 320. In an embodiment of the present invention, the rest of the probe card assembly may include a printed circuit board 1010 (also known as a wiring board), a stiffener ring 1020 (or other similar structure), substrate supports 1030, and an interposer 1040. In this embodiment, the substrate supports 1030 may be coupled to the mounting structures 320. The resulting probe card assembly exhibits excellent parallelism between the probe card reference plane 220 and the probe tip best fit plane 330. It should be noted that the substrate supports may be of any size or structure, including round, square, triangular, elongated, or thick.

Figure 10:
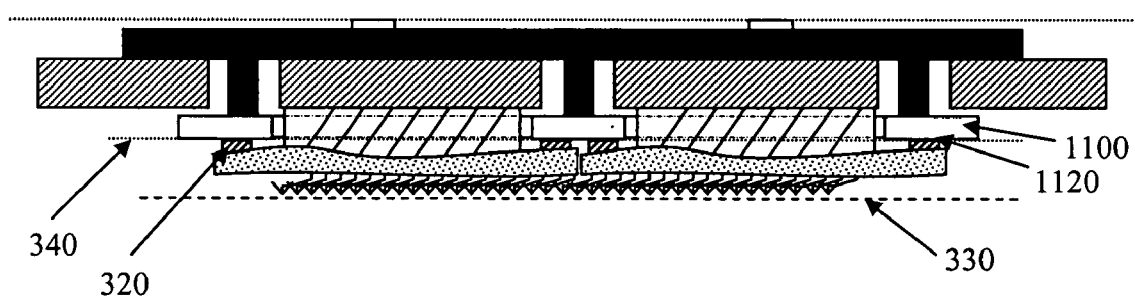
FIG. 10 illustrates a probe card assembly incorporating a sub-mount according to an embodiment of the present invention.

In another embodiment of the present invention, the rest of the probe card assembly may incorporate a sub-mount 1100, as shown in FIG. 10. In this embodiment the sub-mount 1100 may have support surfaces 1120 to which the mounting structures 320 are coupled. As with substrate supports, the support surfaces may be of any size or shape so long as they adequately connect the mounting structures to the wiring board (as with substrate support) or to the sub-mount (as with the support surfaces). Embodiments of probe cards that utilize multiple "tiles" of probe contactor substrates often utilize this sub-mount assembly method. If multiple probe contactor substrates are used in a probe card, the overall planarity of the tips of the probe contactors may be affected by a difference in the thickness between the probe card substrates as well as the other factors already discussed. Thus, to lessen the error caused by differences in thickness of probe contactor substrates and other factors, ideally the z distance between the top exposed surface of a mounting structure 320 and the tip plane 330 of any given "tile" will be within +/−5 µm of the z distance of a mounting structure and the tip plane of any other given "tile." Also ideally, in a multiple-substrate probe card, the plane 340 of the mounting structures of a given tile is within +/−5 µm from the plane 330 of the tips of the probe contactors. This will ensure that the overall planarity target of the probe card is better than +/−10 µm from the ideal planarity.

The mounting structures 320 may be attached to the substrate supports 1030 or the support surfaces 1120 (or any other structure that is utilized in mounting the probe substrate to the probe card assembly) using any appropriate technique that provides a precise and well controlled attachment at the mounting structures 320. Such techniques include adhesive bonding, solder bonding, or mechanical attachment using clamps, screws, clips, and the like. If adhesive or solder is used, features may be incorporated into the mounting structures to provide bond line thickness control such as adhesive wells providing an area that is a few microns to a few tens of microns distant from the surface so that when the structure is placed in close contact to a mounting surface, a well controlled adhesive or solder bond line is maintained.

Figure 4B:
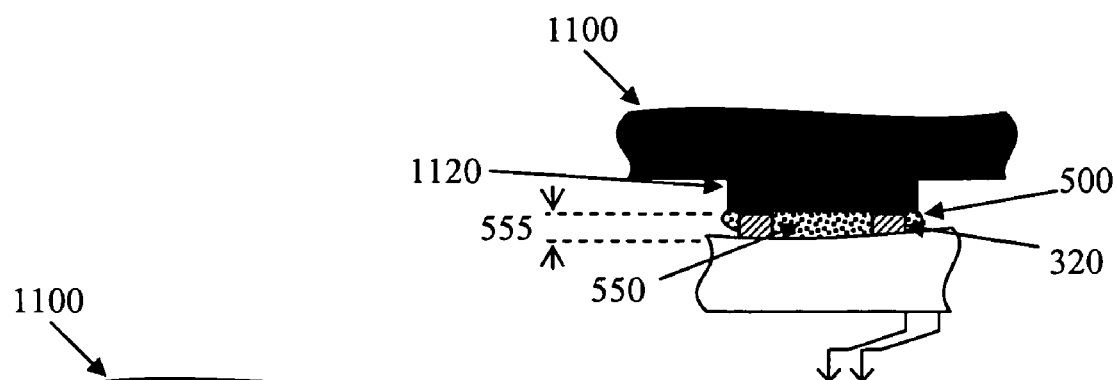
FIG. 4b illustrates another mounting technique according to an embodiment of the present invention.
Figure 4A:
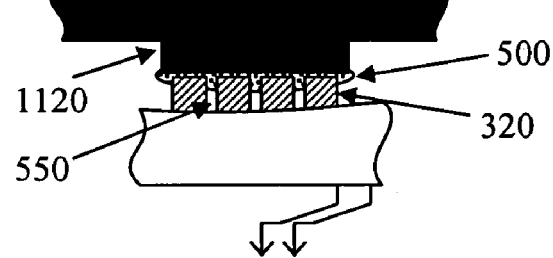
FIG. 4a illustrates a mounting technique according to an embodiment of the present invention.
Figure 5:
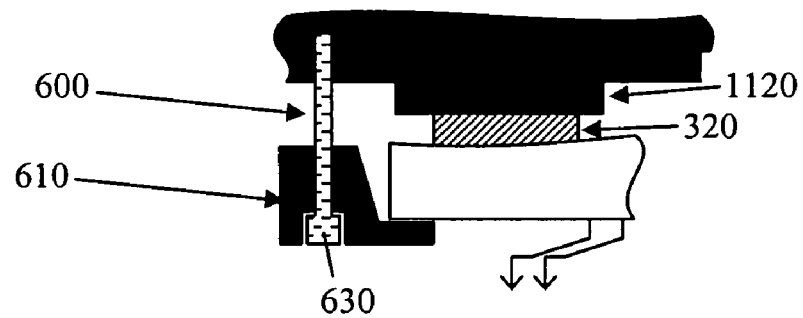
FIG. 5 illustrates another mounting technique according to an embodiment of the present invention.

FIG. 4a illustrates an adhesive (or solder) mounted arrangement where the mounting structure 320 is configured to have wells 550 to allow for adhesive 500 (or solder) over-fill while providing metal-to-metal contact for precise z axis placement independent of bond-line thickness. Any adhesive may be used but high temperature epoxies are preferred (those with a glass transition temperature (Tg) greater than 150° C.). FIG. 4b illustrates another mounting technique similar to that illustrated in FIG. 4a, however, there is only one "well" in FIG. 4b and is included to illustrate the bond line thickness at reference numeral 555. Different adhesives or solders may have different bond line thicknesses at which they are most efficiently effective. If solder is used, a low creep, high temperature material such as gold-tin eutectic is preferred. FIG. 5 illustrates a mechanical clamp arrangement that provides direct metal-to-metal contact between the mounting structure and the corresponding support structure. The clamp shown employs a screw 600 (or other type of fastener), a clamp element 610, and a nut 630, which tightens the screw 600 to the clamp element 610. Similarly, the sub-mount 1100 may be clamped directly to a threaded insert which is coupled to the probe contactor substrate 300, or by a screw fastener going directly through a through-hole in the probe contactor substrate 300.

The process of forming the mounting structures 320 on the probe contactor substrate 300 can be efficiently and precisely done during the same process in which the probe contactors 310 are formed on the probe contactor substrate. In one embodiment, processes similar to those described in U.S. Pat. No. 5,190,637, titled "Formation of microstructures by multiple level deep X-ray lithography with sacrificial metal layers," assigned to the Wisconsin Alumni Research Foundation, and/or any of U.S. patent application Ser. Nos. 11/019,912, 11/102,982, and 11/194,801, all of which are assigned to the present applicant, Touchdown Technologies, Inc. and all of which are incorporated by reference herein, may be used. The following is an example of one way in which a probe head may be formed with mounting structures 320 on the probe contactor substrate, although other methods are possible and intended to be covered by this application.

Figure 6:
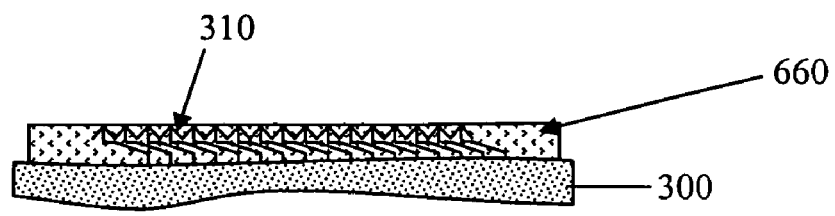
FIGS. 6–8 illustrate steps for forming mounting pads on a probe contactor substrate according to an embodiment of the present invention.

FIG. 6 depicts a probe contactor substrate 300 upon which probe contactors 310 are lithographically electroplated using the methods described in the patent and patent applications listed above. Reference numeral 660 refers to sacrificial metal which is plated around the probe contactors during their formation as described in the patent and patent applications above. After forming the probe contactors 310 and the sacrificial metal 660 on the probe contactor substrate 300, the bottom of the probe contactor substrate (the side without probe contactors) is mounted to a machine chuck. The assembly then passes a cutter or a grinder parallel to the chuck surface and over the probe contactors to cut them to a planar surface (at a plane parallel to the chuck) at a known distance from the chuck. The cutting process may be followed by polishing process as needed to refine the surfaces of the tips of the probe contactors 310.

Figure 7:
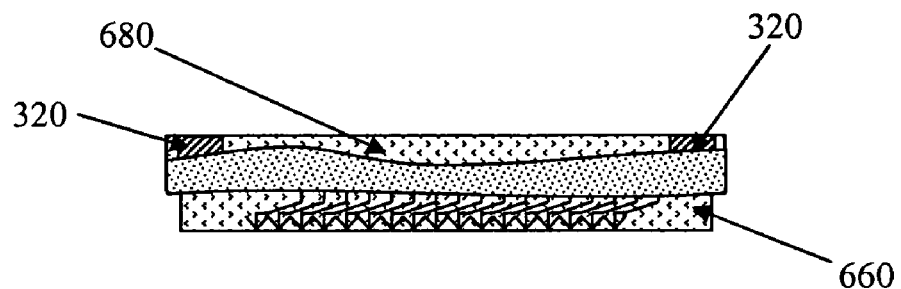
Figure 8:
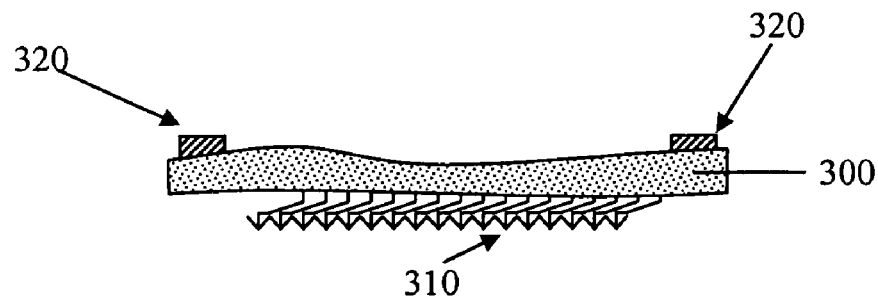

After planarization of the probe contactors 310 and sacrificial metal 660, a plating seed layer is electroplated on the back side of the probe contactor substrate 300. The seed layer is deposited by PVD (physical vapor deposition), electroless plating, screen printing or any other suitable means of obtaining an adherent conductive layer suitable as a plating seed. A photoresist compound is applied to the back side of the probe contactor substrate 300 and is exposed in such a manner so as to define an area and volume for plating of the mounting structures 320. The mounting structures 320 will preferably be plated to a height that is larger than the intended height of the finished mounting structures 320. The rest of the photoresist is then dissolved and the back side of the probe contactor substrate 300 (including the mounting structures 320) is optionally plated with a sacrificial metal 680. Preferably, the sacrificial metal 680 which is plated around the mounting structures 320 is dissolved by the same solution or medium as the sacrificial metal 660 which surrounds the probe contactors 310. The probe head is then placed in the machine chuck again, this time with the probe contactors 310 and sacrificial metal 660 placed against the chuck's surface. The assembly then passes a cutter or grinder parallel to the planarized surface of the probe contactors/sacrificial substrate, and the mounting structures 320 and sacrificial metal 680 is planarized such that they are parallel to, and a known distance from, the plane of the probe contactors 310. The result is illustrated in FIG. 7. The final step is the etching away of the sacrificial metals 660, 680 to expose the probe contactors 3310 and the mounting structures 320 as shown in FIG. 8.

By using this process, the mounting structures 320 may be formed with lithographic precision and using the same process used to create the probe contactors, thereby doing so efficiently.

While the description above refers to particular embodiments of the present invention, it will be understood that many alternatives, modifications and variations may be made without departing from the spirit thereof. The accompanying claims are intended to embrace such alternatives, modifications and variations as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A probe head for testing semiconductor wafers, comprising:
   a probe contactor substrate having a top side and a bottom side;
   a plurality of probe contactor tips coupled to the bottom side, the plurality of probe contactor tips lying substantially in a first plane; and
   a plurality of sub-mounts, each having an upper surface and a lower surface, the lower surface coupled to the top side, and each upper surface being machined such that each upper surface lies substantially in a second plane, wherein the first plane is substantially parallel to the second plane, and each upper surface is adapted to be attached to another mounting structure.

2. The probe head of claim 1, wherein the plurality of sub-mounts are lithographically plated to the probe contactor substrate.

3. The probe head of claim 1, wherein the plurality of sub-mounts include at least one recessed portion adapted for receiving one of an adhesive or a solder.

4. The probe head of claim 1, wherein the plurality of sub-mounts are metal.

5. The probe head of claim 1, wherein the probe contactor substrate is of non-uniform thickness.

6. The probe head of claim 1, wherein the first plane is less than 10 μm from parallel of the second plane.

7. A probe card assembly, comprising:
   a wiring board;
   a probe contactor substrate having a top side and a bottom side; a plurality of probe contactor tips coupled to the bottom side, the plurality of probe contactor tips lying substantially in a first plane; and
   a plurality of sub-mounts, each having an upper surface and a lower surface, the lower surface coupled to the top side, and each upper surface being machined such that each upper surface lies substantially in a second plane, wherein the first plane is substantially parallel to the second plane, and each upper surface is adapted to be coupled to wiring board.

8. The probe card assembly of claim 7, further including an interposer coupled between the probe contactor substrate and the wiring board.

9. The probe card assembly of claim 7, further including at least one post coupled between the wiring board and at least on of the plurality of sub-mounts, wherein the post is adhesively bonded to the at least one of the plurality of sub-mounts.

10. The probe card assembly of claim 9, wherein the at least one of the plurality of sub-mounts has a recessed portion adapted to receive one of an adhesive or a solder.

11. The probe card assembly of claim 10, wherein the recessed portion is an adhesive well.

12. The probe card assembly of claim 7, wherein the first plane is less than 10 μm from parallel of the second plane.

13. The probe card assembly of claim 7, wherein the probe contactor substrate is of non-uniform thickness.

14. The probe card assembly of claim 7, wherein the plurality of sub-mounts are lithographically plated to the probe contactor substrate.

15. The probe card assembly of claim 7, further including a clamp coupled to at least one of the plurality of sub-mounts, the clamp at least partially securing the wiring board to the at least one sub-mount.

16. A probe card assembly, comprising:
a wiring board;
a sub-assembly mount coupled to the wiring board
a first and second plurality of connectors coupled to the sub-assembly mount;
a first probe contactor subassembly having a probe contactor substrate with a first side and a second side, a first plurality of probe contactor tips coupled to the first side and the first plurality of probe contactor tips lying in a first plane, a first plurality of sub-mounts, each of the plurality of sub-mounts having a top surface machined such that each top surface lies in a second plane, wherein the second plane is substantially parallel to the first plane, and the first plurality of connectors are coupled to the first plurality of sub-mounts; and
a second probe contactor subassembly having a second probe contactor substrate with a bottom side and a top side, a second plurality of probe contactor tips coupled to the bottom side and the second plurality of probe contactor tips lying in a third plane, a second plurality of sub-mounts, each of the second plurality of sub-mounts having a top surface machined such that each top surface lies in a fourth plane, wherein the third plane is substantially parallel to the fourth plane, and the second plurality of connectors are coupled to the second plurality of sub-mounts.

17. The probe card assembly of claim 16, wherein the first plane is substantially co-planar with the third plane.

18. The probe card assembly of claim 16, wherein the second plane is substantially co-planar with the fourth plane.

19. The probe card assembly of claim 16, wherein the difference between a first z-height of at least one of the first plurality of sub-mounts and a second z-height of at least one of the second plurality of sub-mounts is less than 5 μm, the first z-height being measured from the first plane to the top surface of the at least one of the first plurality of sub-mounts and the second z-height being measured from the third plane to the top surface of the at least one of the plurality of sub-mounts.

20. The probe card assembly of claim 16, wherein the first plane is less than 10 μm from parallel of the second plane.

21. The probe card assembly of claim 16, wherein the first probe contactor substrate is of non-uniform thickness.

22. The probe card assembly of claim 16, wherein the first and second pluralities of sub-mounts are lithographically plated to the first and second probe contactor substrates respectively.

23. The probe card assembly of claim 16, further including a clamp coupled between the first probe contactor substrate and the sub-assembly mount, the clamp at least partially securing the first probe contactor substrate to the sub-assembly mount.

24. A method of forming a probe head comprising:
providing a probe contactor substrate;
forming a plurality of probe contactors on a first side of the probe contactor substrate, each of the plurality of probe contactors having a tip, and each tip lying in a first plane;
lithographically electroplating a plurality of sub-mounts to a second side of the probe contactor substrate, each of the plurality of sub-mounts having a top edge;
machining each of the top edges of the plurality of sub-mounts such that the top edges lie in a second plane, and the first plane and the second plane are substantially parallel.

25. The method of claim 24, wherein the plurality of probe contactors are lithographically electroplated to the first side.

26. The method of claim 25, wherein the forming the plurality of probe contactors and the lithographically electroplating a plurality of sub-mounts occurs during substantially the same process.

27. A method of forming a probe head, comprising:
providing a probe contactor substrate;
electroplating a plurality of probe contactors on a first side of the substrate;
electroplating a first sacrificial metal over the first side and the plurality of probe contactors;
machining the first sacrificial metal and the plurality of probe contactors at a first plane;
electroplating a plurality of mounts to a second side of the probe contactor substrate;
electroplating a second sacrificial metal over the second side and the plurality of mounts;
machining the second sacrificial metal and the plurality of mounts at a second plane; and
removing the first and second sacrificial metals.

28. The method of claim 27, wherein the first plane and the second plane are substantially parallel.

29. The method of claim 28, wherein the first plane is less than 10 μm from parallel of the second plane.

30. The method of claim 27, wherein the first sacrificial metal and the second sacrificial metal are removed by the same process.

31. The method of claim 27, wherein the probe contactor substrate is of non-uniform thickness and the plurality of mounts are machined to create the second plane substantially parallel to the first plane.

* * * * *